United States Patent
Funayama et al.

(10) Patent No.: US 8,391,044 B2
(45) Date of Patent: Mar. 5, 2013

(54) SEMICONDUCTOR MEMORY DEVICE

(75) Inventors: Kouyou Funayama, Kawasaki (JP); Ryo Sudo, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 182 days.

(21) Appl. No.: 13/052,188

(22) Filed: Mar. 21, 2011

(65) Prior Publication Data

US 2011/0249482 A1    Oct. 13, 2011

(30) Foreign Application Priority Data

Apr. 9, 2010   (JP) ................................ 2010-090882

(51) Int. Cl.
*G11C 5/06* (2006.01)
(52) U.S. Cl. ................. 365/63; 365/185.05; 365/230.05
(58) Field of Classification Search ............. 365/185.05, 365/230.05, 63
See application file for complete search history.

(56) References Cited

U.S. PATENT DOCUMENTS 7,382,649 B2 * 6/2008 Matsunaga et al. ...... 365/185.05
2006/0018181 A1 * 1/2006 Matsunaga et al. ...... 365/230.05

FOREIGN PATENT DOCUMENTS

JP    2009-141222    6/2009

* cited by examiner

*Primary Examiner* — Fernando Hidalgo
(74) *Attorney, Agent, or Firm* — Oblon, Spivak, McClelland, Maier & Neustadt, L.L.P.

(57) ABSTRACT

According to one embodiment, a semiconductor memory device includes a first active area in a semiconductor substrate, memory cells on the semiconductor substrate, first bit lines, first line, a second line, a third line, and a fourth line. The first line extends in a direction that intersects with the first bit lines and transmits a control potential applied to unselected ones of second bit lines connected to the memory cells. The second line is electrically connected to the first line and extends along the first bit lines. The third line is electrically connected to the second line and extends in a direction that intersects with the first bit lines. The fourth line electrically connects both the third line and portions in the active area corresponding to nodes to which the control potential is applied.

13 Claims, 9 Drawing Sheets

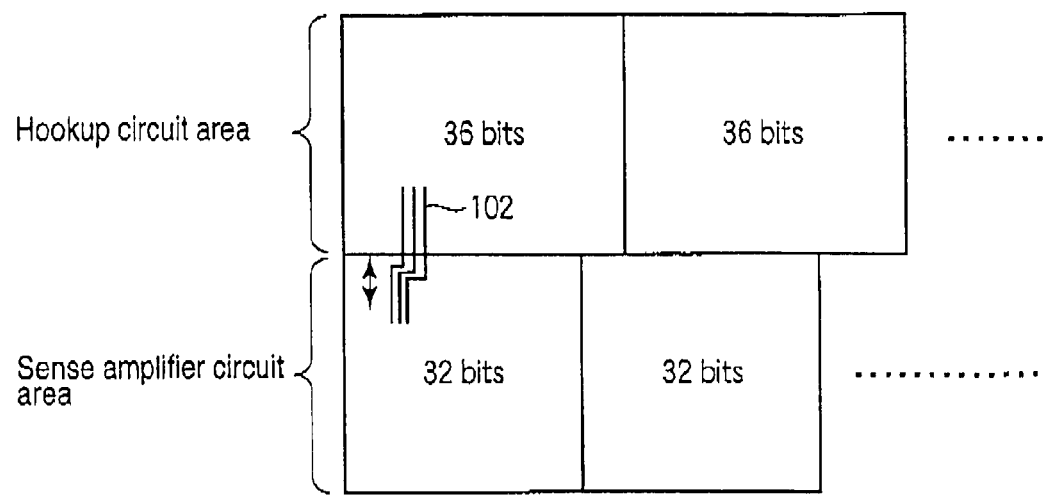
F I G. 2
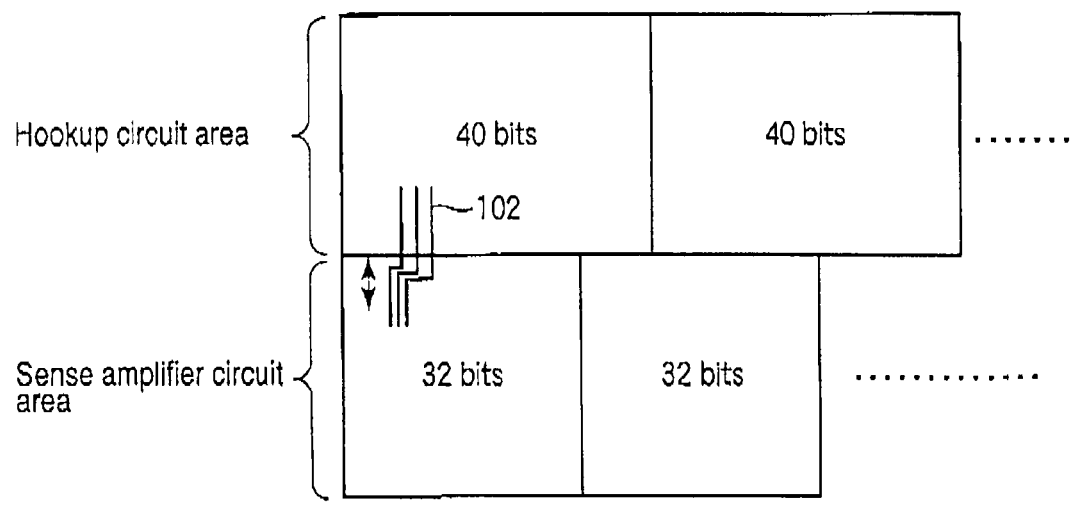
F I G. 3

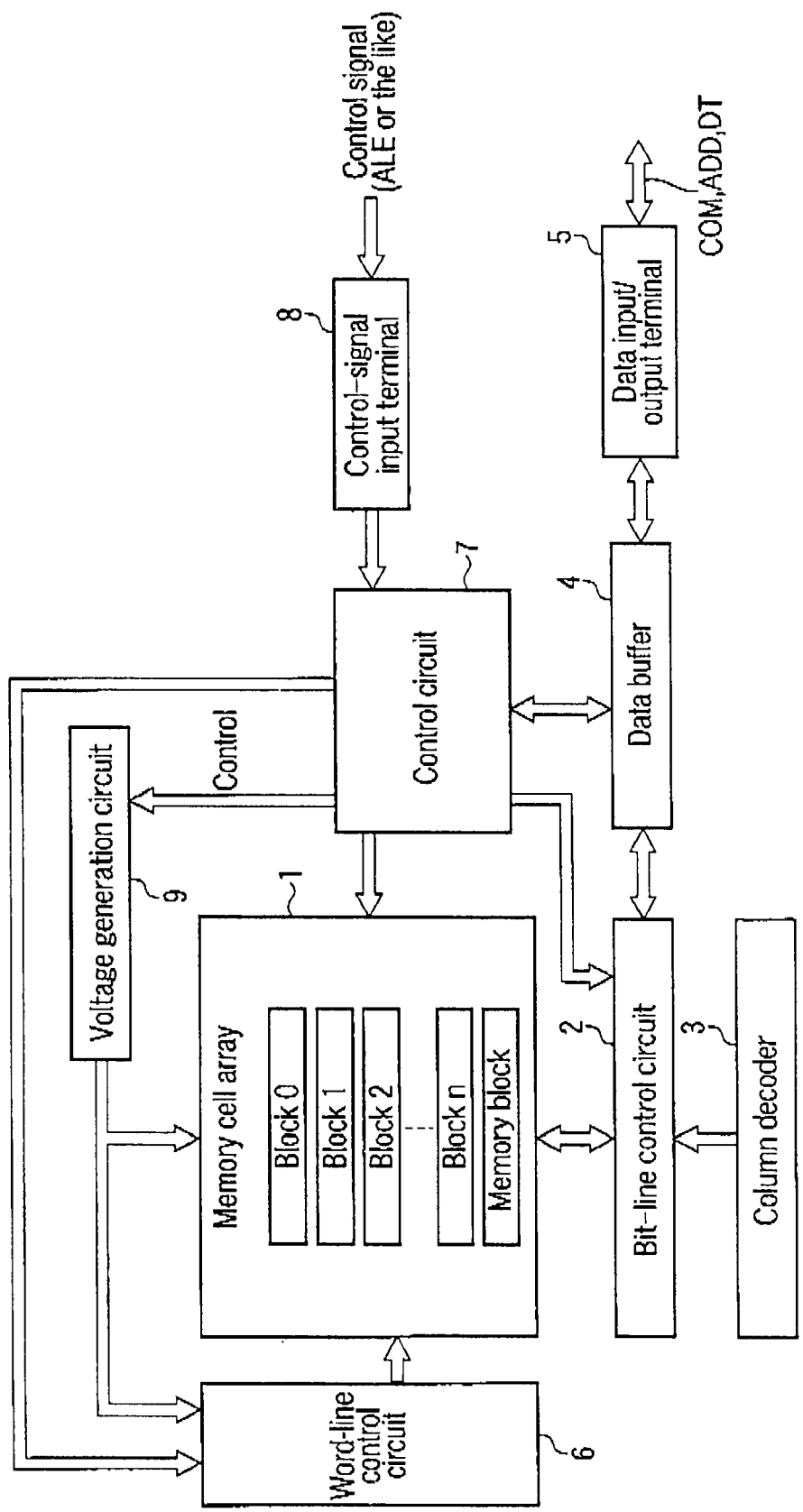
F I G. 4

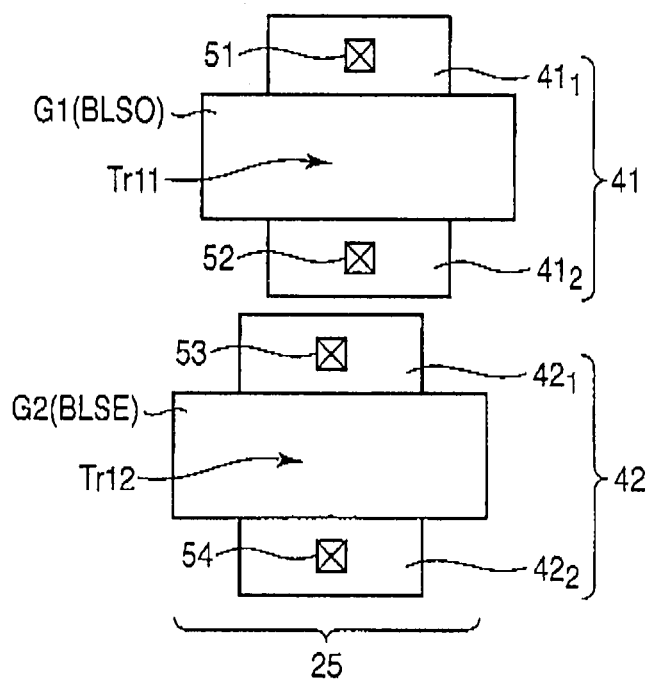
F I G. 12
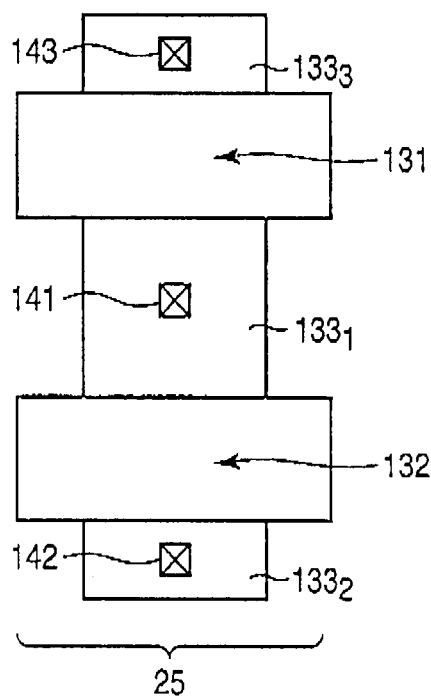
F I G. 13

SEMICONDUCTOR MEMORY DEVICE

CROSS-REFERENCE TO RELATED APPLICATIONS

This application is based upon and claims the benefit of priority from Japanese Patent Application No. 2010-090882, filed Apr. 9, 2010; the entire contents of which are incorporated herein by reference.

FIELD

Embodiments described herein relate generally to a semiconductor memory device.

BACKGROUND

A nonvolatile semiconductor memory device represented by a flash memory is further miniaturized and it becomes extremely difficult to arrange elements in an area that tends to be reduced.

Reduced minimum line-and-space dimension may generate a problem if an attempt is made to arrange elements that can be arranged with the conventional dimensions in the same position as in the conventional case. Particularly, the bit line dimension may often conform to the minimum line-and-space and components in an area in which bit lines are densely arranged tend to be influenced by miniaturization. However, since the components that are difficult to be arranged are necessary for the operation of the semiconductor memory device, they need to be arranged by an alternative method. Such alternative method also needs to avoid greatly increasing the chip area.

BRIEF DESCRIPTION OF THE DRAWINGS

FIG. 2 illustrates a possible configuration for solving the above problem.

FIG. 3 illustrates another possible configuration for solving the above problem.

FIG. 4 is a block diagram illustrating the whole configuration of a semiconductor memory device according to a first embodiment.

FIG. 12 illustrates the layout of components of a part of a bit line control circuit of a semiconductor memory device according to a second embodiment.

FIG. 13 is a layout diagram of a portion corresponding to FIG. 12 when the second embodiment is not applied.

DETAILED DESCRIPTION

In general, according to one embodiment, a semiconductor memory device includes a first active area in a semiconductor substrate, memory cells on the semiconductor substrate, first bit lines, first line, a second line, a third line, and a fourth line. The first line extends in a direction that intersects with the first bit lines and transmits a control potential applied to unselected ones of second bit lines connected to the memory cells. The second line is electrically connected to the first line and extends along the first bit lines. The third line is electrically connected to the second line and extends in a direction that intersects with the first bit lines. The fourth line electrically connects both the third line and portions in the active area corresponding to nodes to which the control potential is applied.

Prior to the description for embodiments, a reference example is described with reference to FIG. 1 to FIG. 3.

Figure 1:
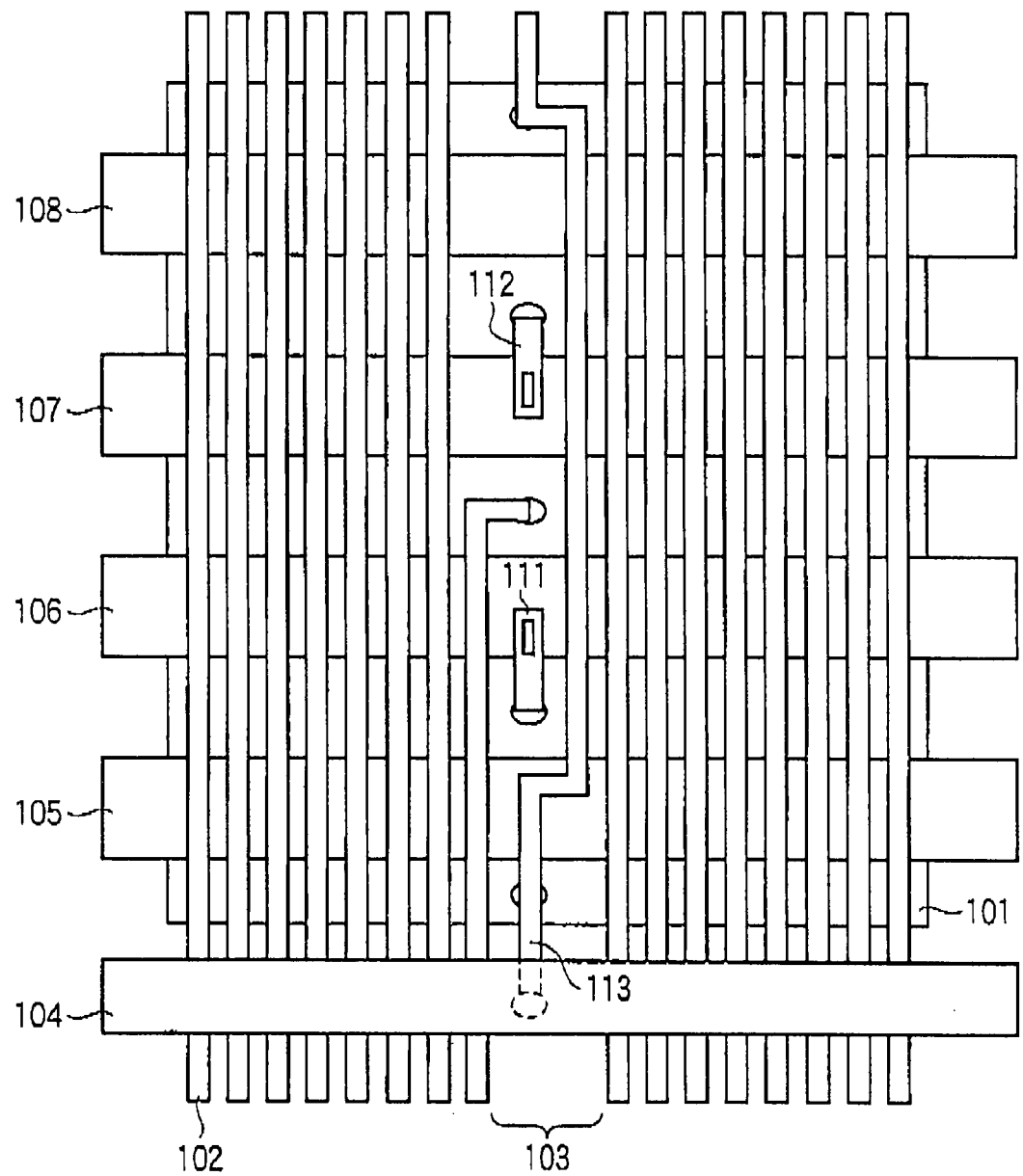
FIG. 1 illustrates the layout of a part of a semiconductor memory device of a reference example.

FIG. 1 shows the layout of a part of a semiconductor memory device. Specifically, FIG. 1 shows the layout of a hookup circuit (bit line control circuit) area for controlling bit lines. The hookup circuit area is provided between a memory cell array and a sense amplifier circuit area. As shown in FIG. 1, bit lines extend in a Y direction (vertical direction) of the drawing in an upper layer along a Z direction (a direction penetrating the drawing) of an active area 101. SABL lines 102 are connected at the lower ends thereof to a sense amplifier circuit (not shown) and have the minimum line-and-space (L/S) dimension. The SABL lines 102 are realized by a first (lowest) metal line, or interconnect (M0 line), and every preset number of the lines (for example, every 16 lines) form every one of units (each bit line group). In the boundary between the two bit line groups, there is a region 103 having a width larger than the space width that defines the minimum L/S.

A bit line control signal line 104 and lines 105, 106, 107, 108 are provided along an X direction (horizontal direction) in the drawing. The bit line control signal line 104 is realized by a second (second-lowest) metal line (M1 line). The respective lines 104 to 108 configure transistors together with impurity diffusion layers formed in the active area 101 in portions that are adjacent to the respective lines.

Lines 111, 112, 113 are formed in the region 103. The lines 111, 112, 113 are realized by use of the M0 line. The lines 111, 112 extend along the Y direction at the same point in an axis that connects the right and left ends of the drawing. The line 111 extends from the active area 101 between the lines 105 and 106 to region above the line 106 in the Z direction. Likewise, the line 112 extends from a region above the line 107 in the Z direction to the active area 101 between the lines 107 and 108.

The line 113 is for transmitting a signal on the bit line control signal line 104 to a plurality of active areas in the region 103 and connected at a first end to the bit line control signal line 104 via a contact. The line 113 generally extends in the Y direction while bypassing the lines 111, 112 through the two crank-shaped portions. Specifically, the line 113 extends in the Y direction from a region below the bit line control signal line 104 in the Z direction and has a crank-shape portion above the line 105 in the Z direction. The line 113 bypasses the line 111 through the crank-shape portion, extends in the Y direction between the line 111 and the SABL line 102 adjacent thereto and makes a crank shape in a region above the line 108 in the Y direction and above the active area 101 in the Z direction. Then, the line 113 further extends in the Y direction. The line 113 is connected to the active area 101 between the bit line control signal line 104 and the line 105 and the active area 101 above the line 108 in the Y direction via respective contacts.

The layout of FIG. 1 cannot be maintained in some cases with the next-generation minimum L/S dimension such as 55 nm/55 nm) that is smaller than the minimum L/S dimension such as 74 nm/74 nm of a generation that can maintain the layout of FIG. 1. More specifically, a space in which a portion of the line 113 between the lines 111, 112 and the SABL line 102 runs becomes insufficient, the portion cannot be desirably patterned in a lithography process and it may be in contact with the adjacent SABL line 102 or the lines 111, 112. It is thus necessary to take a measure for simultaneously realizing the next-generation minimum L/S dimension and the arrangement of the line 113. To this end, the following two measures may be possible.

The first measure is to form a semiconductor memory device with the next-generation minimum L/S dimension such as 55 nm/55 nm and form only SABL lines with a width of the L/S dimension slightly smaller than the defined minimum L/S dimension such as 53 nm/53 nm. This measure can prevent the line 113 from making contact with the other line such as the SABL line 102 and the layout of FIG. 2 can also be maintained. However, it is found out that a processing technique of realizing the next-generation minimum L/S dimension cannot realize further reduced L/S dimension. That is, the processing condition cannot cope with the further reduced L/S dimension. Therefore, the first measure cannot be adopted.

The second measure is to use different dimensions of the region 103 in the sense amplifier circuit area and hookup circuit area as shown in FIG. 2, FIG. 3. Assume that two set of 16 SABL lines and the width therebetween form a unit structure and the width of one unit structure is conveniently referred to as 32-bit width. Then, as shown in FIG. 2, FIG. 3, only unit structures in the hookup circuit area is formed to have a width larger than the 32-bit width, such as a 36-bit or 40-bit width. Such second measure can secure sufficiently large space between the two set of bit line groups and arrange the lines for transmission of a bit line control signal with the same layout as that of FIG. 1.

However, as is clearly understood from FIG. 2, FIG. 3, the second measure results in unmatched boundaries of unit structures between the sense amplifier circuit area and the hookup circuit area. Therefore, it is necessary to form the SABL lines 102 in a crank form near the boundary between the sense amplifier circuit area and the hookup circuit area. If many crank-shaped bit lines are cumulatively formed, the length (indicated by an arrow) of the crank portion in the Y direction becomes larger than that without the crank portion. This leads to an increase in the area of the semiconductor chip and the second measure cannot be adopted.

In the following description, embodiments configured based on the above knowledge is explained with reference to the accompanying drawings. In the following explanation, components having substantially the same functions and configurations are denoted by the same symbols and repetitive explanation is made only when necessary. However, it should be noted that the drawings are only schematically shown. In the embodiments described below, devices and methods that embody the technical idea of embodiments are shown as examples and the technical idea of the embodiments is not limited to the materials, shapes, structures, arrangements and the like of the components described below. The technical idea of embodiments can be variously modified within the scope of the claims.

First Embodiment

FIG. 4 is a block diagram illustrating an example of the whole configuration of a semiconductor memory device according to a first embodiment. As shown in FIG. 4, a NAND flash memory according to this embodiment includes a memory cell array 1, bit line control circuit 2, column decoder 3, data buffer 4, data input/output terminal 5, word line control circuit 6, control circuit 7, control signal input terminal 8 and voltage generation circuit 9.

The memory cell array 1 includes blocks (Block 0 to Block n) and at least one memory block. Each block includes memory cells, word lines, bit lines and the like. Each block is configured by pages each formed of memory cells and will be explained in detail later. The memory cell array 1 is electrically connected to the bit line control circuit 2, word line control circuit 6, control circuit 7 and voltage generation circuit 9.

The bit line control circuit 2 reads data in the memory cell of the memory cell array 1 via a bit line and detects the state of the memory cell of the memory cell array 1 via the bit line. Further, the bit line control circuit 2 applies a program voltage to the memory cell in the memory cell array 1 via a bit line to program data in the memory cell. The bit line control circuit 2 is electrically connected to the column decoder 3, data buffer 4 and control circuit 7.

The bit line control circuit 2 includes sense amplifiers (S/A) and data storage circuits (not shown). One of the data storage circuits is selected by means of the column decoder 3. Data of the memory cell read to the data storage circuit is output to the exterior from the data input/output terminals 5 via the data buffer 4. For example, the data input/output terminals 5 are connected to an external device of the NAND flash memory. The data input/output terminals 5 receive various commands COM, addresses ADD to control the operation of the NAND flash memory and receive and output data DT. Program data DT input to the data input/output terminals 15 is supplied to the data storage circuit selected by the column decoder 3 via the data buffer 4. Further, the command COM and address ADD are supplied to the control circuit 7. The sense amplifier amplifies a potential on the bit line.

The word line control circuit 6 selects the word line in the memory cell array 1 under the control of the control circuit 7. Further, the word line control circuit 6 receives voltages required for reading, programming and erasing data from the voltage generation circuit 9. The word line control circuit 6 applies the voltages to the selected word line.

The control circuit 7 is electrically connected to the memory cell array 1, bit line control circuit 2, column decoder 3, data buffer 4, word line control circuit 6 and voltage generation circuit 9 to control them. The control circuit 7 is connected to the control signal input terminals 8 and controlled by control signals such as an address latch enable (ALE) signal supplied from the exterior via the control signal input terminal 8. The control circuit 7 outputs control signals, which will be described later, to the voltage generation circuit 9 to control the voltage generation circuit 9.

The voltage generation circuit 9 applies necessary voltages to components such as the memory cell array 1 and word line control circuit 6 in the programming, reading and erasing operations under the control of the control circuit 7.

An example of the configuration of the block (Block) is now explained with reference to FIG. 5. In the following description, the reference is made with one block Block taken as an example. All memory cell transistors MT in block Block are simultaneously erased. That is, the block is an erase unit.

Figure 5:
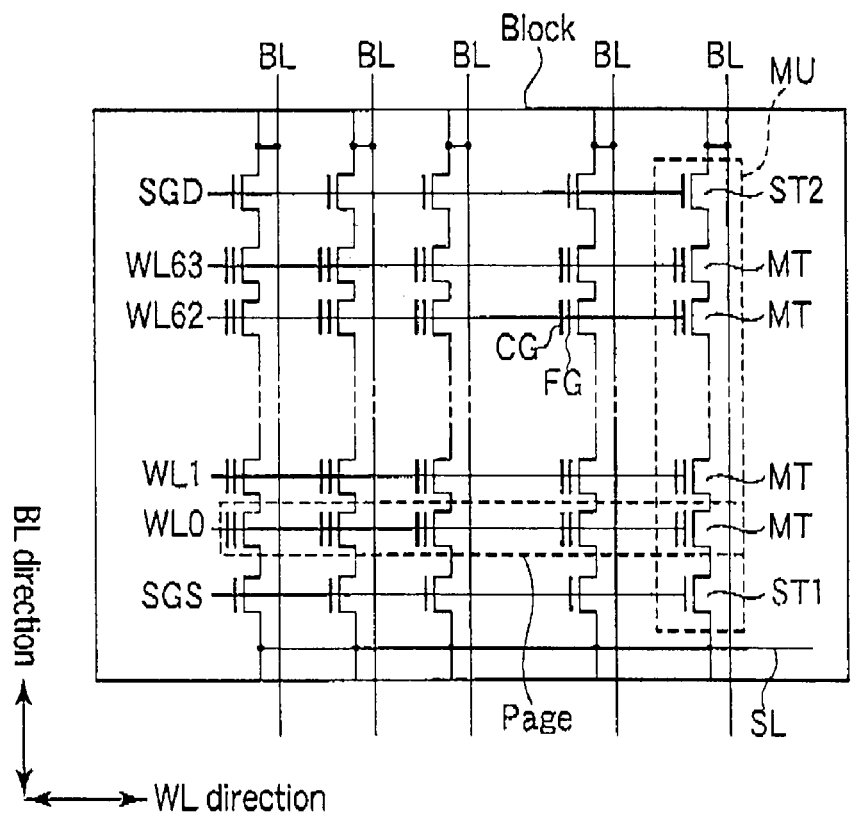
FIG. 5 is a circuit diagram illustrating a specific example of a block.
Figure 6:
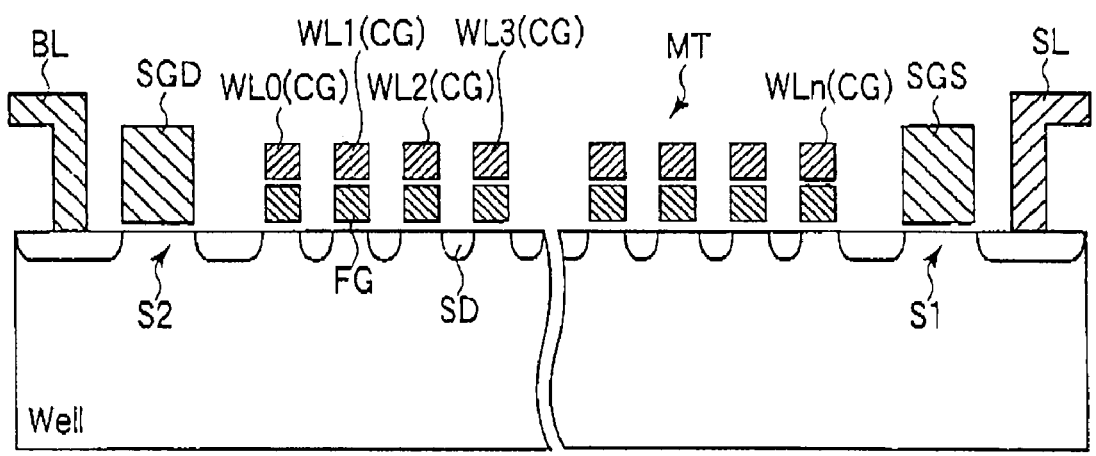
FIG. 6 is a cross-sectional view illustrating the specific example of the block.

As shown in FIG. 5, FIG. 6, block Block includes memory cell strings (memory units) MU arranged along the word line (WL) direction. Memory cell string MU includes a NAND string and select transistors ST1, ST2. The NAND string includes memory cell transistors (for example, 64 transistors) MT whose current paths (source/drain SD) are serially connected. The select transistors ST1 and ST2 are respectively connected to both ends of the NAND string. The other end of the current path of the select transistor ST2 is connected to the bit line BL and the other end of the current path of the select transistor ST1 is connected to source line SL.

Word lines WL0 to WL63 extend in the WL direction and each is connected to memory cell transistors MT belonging to a corresponding one of the rows. Select gate SGD extends in the WL direction and is connected to all of the select transistors ST2 in the block. Select gate SGS extends in the WL direction and is connected to all of the select transistors ST1 in the block.

Memory cell transistors MT connected to the same word line WL configure a unit referred to as a page. The read and program operations are performed in units of pages. If one memory cell is a multi-valued memory cell that can hold plural-bit data, plural pages are assigned to each word line.

A memory cell MT is provided at each intersection between bit line BL and the word line WL. The memory cell MT is formed on a well formed in a semiconductor substrate. The well is connected to the voltage generation circuit 9 and a preset voltage is applied thereto from the voltage generation circuit 9. Memory cell MT includes a tunnel insulating film (not shown) formed on the well, floating electrode (floating gate electrode) FG used as a charge trapping layer, inter-gate insulating film (not shown) and control electrode (control gate electrode) CG (word line WL) and source/drain regions SD. The source/drains that are part of the current path of memory cell transistor MT are serially connected with the source/drains of adjacent memory cell transistors MT. The select transistors ST1, ST2 respectively include gate insulating films (not shown) formed on the semiconductor substrate, gate electrodes SGS, SGD and source/drain regions SD.

Figure 7:
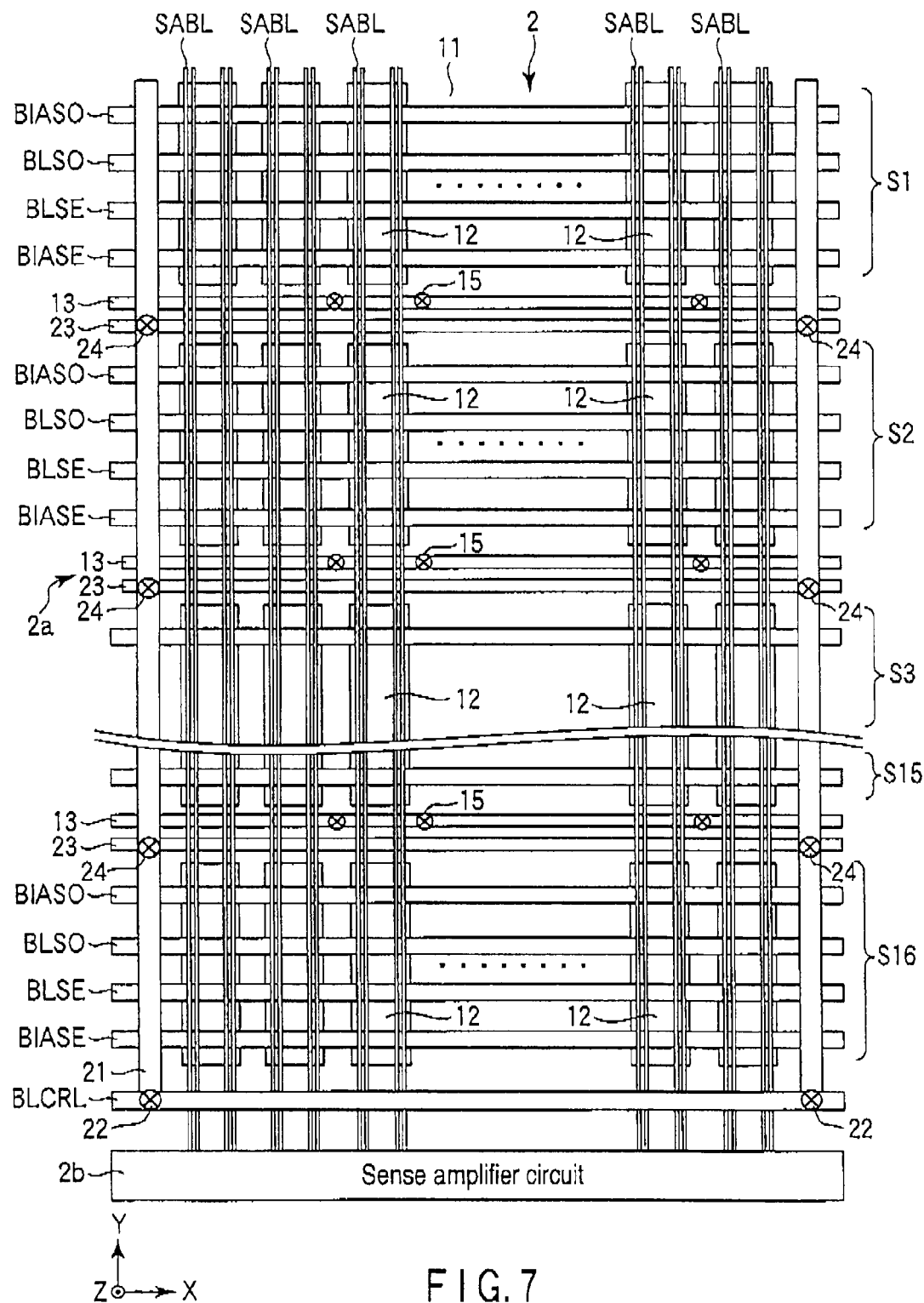
FIG. 7 is a layout diagram of components of a bit line control circuit of the semiconductor memory device according to the first embodiment.
Figure 8:
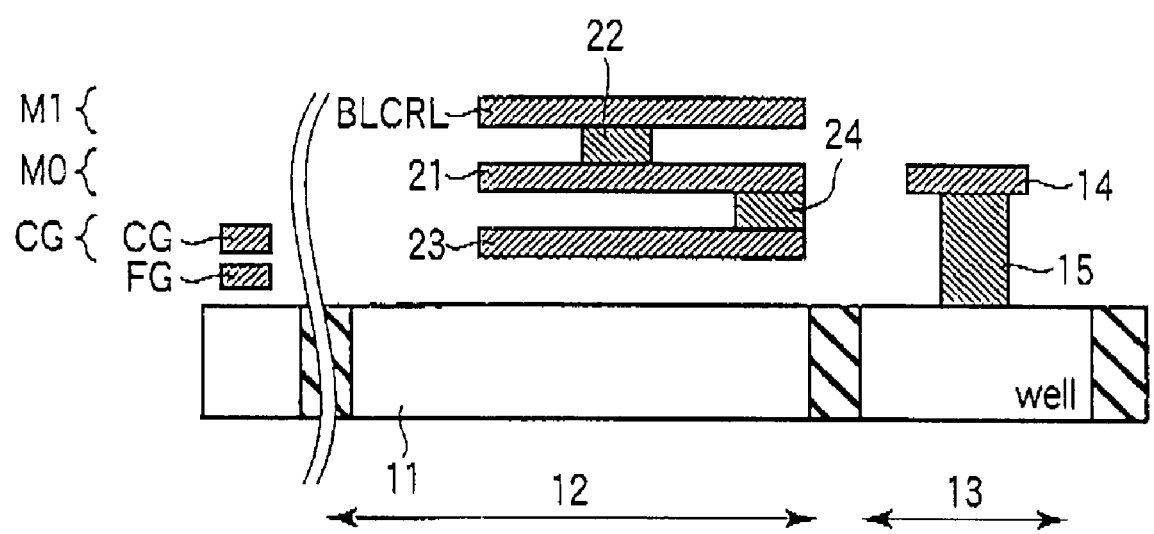
FIG. 8 is a cross-sectional view illustrating a part of FIG. 7.

FIG. 7 illustrates the layout of components of the bit line control circuit 2. FIG. 8 is a cross-sectional view illustrating a part of FIG. 7. As shown in FIG. 7, FIG. 8, the bit line control circuit 2 includes a hookup circuit area 2a and sense amplifier circuit area 2b. The hookup circuit area 2a is divided into segments aligned along the Y direction (or, along the vertical direction of the drawing). In FIG. 7, 16 segments S1 to S16 are illustrated. In each segment, active areas 12 are formed on the surface of the substrate 11. The active areas 12 are isolated in the boundary between each adjacent two of segments S1 to S16. On the surface of the substrate 11, potential application regions (sub con) 13 are formed. The potential application region 13 extends in the X direction, or in the horizontal direction in the drawing and is used to apply a potential to the well (not shown) in the substrate 11. The potential application regions 13 needs to be arranged at preset intervals determined by the design rule in the Y direction and provided between adjacent two active areas 12 in some of the boundaries between segments S1 to S16. The potential application region 13 and active area 12 are spaced. The potential application region 13 may be provided in each boundary between the segments S1 to S16.

Above the potential application regions 13 in the Z direction, or in the direction penetrating FIG. 7, well potential lines 14 are provided. The well potential lines 14 extend in the X direction along the potential application regions 13, are connected to respective potential application regions 13 via a contact 15 in an adequate portion and are applied with a voltage from the voltage generation circuit 9.

SABL lines (which are bit lines connected to the sense amplifier circuit 2b) SABL extend in the Y direction. SABL lines SABL are arranged with the minimum line-and-space dimension of the semiconductor memory device according to the present embodiment, for example. SABL lines SABL are realized by a metal line, or M0 line which is first (lowest) from the substrate in the Z direction. One end of each SABL line SABL is connected to the sense amplifier circuit 2b. SABL lines SABL of the same number as that of segments S1 to S16 (for example, for every 16 lines) configure an SABL, line group. Each of 16 bit lines SABL in one bit line group is connected to the active area 12 in a corresponding one of the segments S1 to S16 via a contact. In the SABL line group, a region (to be explained in detail later) having a width larger than the width of a space that defines the minimum line-and-space pattern is provided. For example, the contact 15 can be formed in the region of the SABL line group.

In each of the segments S1 to S16, signal lines BIASE, BLSE, BIASO, BLSO extend in the X direction. Signal lines BIASE, BLSE, BIASO, BLSO are separate and realized by the same conductive layer as that of gate control electrode CG (FIG. 6) formed above the substrate 11 with the insulating film therebetween. The potentials of signal lines BIASE, BLSE, BIASO, BLSO are controlled by the control circuit 7.

In the bottom of the bit line control circuit 2 in the Y direction, bit line control signal line (M1) BLCRL is provided. Bit line control signal line BLCRL extends in the X direction and is realized by the M1 line and the potential thereof is controlled by the control circuit 7.

On both ends of the bit line control circuit 2 in the X direction, shunt lines 21 are provided. The shunt lines 21 extend in the Y direction over the entire hookup circuit 2a and are realized by the M0 line. The shunt lines 21 are connected to the bit line control signal line BLCRL via contacts 22.

Between at least some of the potential application regions 13 and the active areas 12 adjacent thereto, bit line control signal lines (CG) 23 are formed above the surface of the substrate 11. The bit line control signal lines 23 are provided in at least some or all of regions between the potential application regions 13 and the active areas 12 and extend in the X direction. The bit line control signal lines 23 are realized by the same conductive layer as that of gate control electrode CG (FIG. 6) formed above the substrate 11 with the insulating film disposed therebetween. That is, the bit line control signal lines 23 are formed by patterning the conductive layer that is to form control gate electrode CG. The bit line control signal lines 23 are formed to intersect with the shunt lines 21 and connected to the shunt lines 21 via contacts 24 at the intersections.

Figure 9:
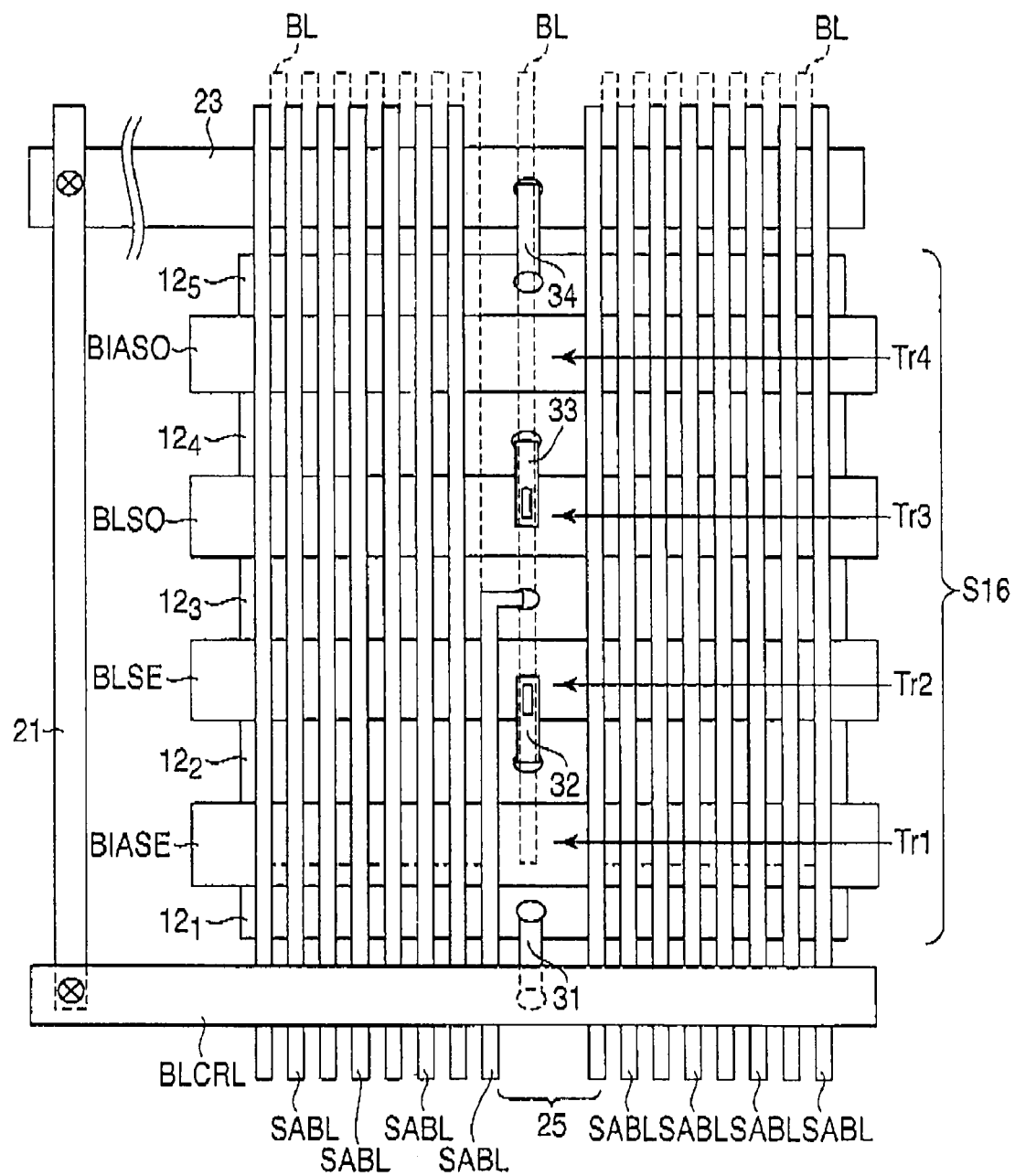
FIG. 9 is a layout diagram of components of a part of a hookup circuit area of the semiconductor memory device according to the first embodiment.

FIG. 9 is a layout diagram of components of a part of the hookup circuit area 2a. Specifically, FIG. 9 illustrates one SABL line group in the segment S16, which lies nearest to bit line control signal line BLCRL. As shown in FIG. 9, a transistor Tr1 includes a signal line BLASE, an impurity diffusion layer in an active area (an active area between signal line BLASE and bit line control signal line BLCRL) $12_1$ adjacent to the bit line control signal line BLCRL and an impurity diffusion layer in an active area $12_2$, which lies between the signal lines BLASE and BLSE. A transistor Tr2 includes a signal line ELSE, an impurity diffusion layer in the active area $12_2$ and an impurity diffusion layer in an active area $12_3$, which lies between the signal lines BLSE and BLSO. A transistor Tr3 includes a signal line BLSO, an impurity diffusion layer in the active area $12_3$ and an impurity diffusion layer in an active area $12_4$, which lies between the signal lines BLSO and BIASO. A transistor Tr4 includes a signal line BIASO, an impurity diffusion layer in the active area $12_4$ and an impurity diffusion layer in an active area $12_5$, which lies between the signal lines BIASO and the bit line control signal lines 23.

In the SABL line group, a region 25 is provided. The width of the region 25 is larger than the width of a space defining the minimum line-and-space pattern as described before. One of the SABL lines SABL (for example, SABL line SABL nearest to the region 25) is connected to the impurity diffusion layer in the active area $12_3$ via a contact. Likewise, each of other SABL lines SABL is connected to the active area 12 in a corresponding one of the segments S1 to S15 via a contact.

In the region 25, lines 31, 32, 33, 34 are provided. The lines 31 to 34 extend in the Y direction and are realized by the M0 line.

The line 31 extends above the bit line control signal line BLCRL and active area $12_1$. The line 31 is connected at one end to the bit line control signal line BLCRL via a contact and connected at the other end to the active area $12_1$ via a contact. The line 32 extends above the active area $12_2$ and signal line ELSE. The line 32 is connected at one end to the active area $12_2$ via a contact and connected at the other end to the bit line BL via a contact. The bit line BL is realized by the M1 line and extends in the Y direction like SABL line SABL and the end thereof opposite to the end connected to the active area $12_2$ reaches the memory cell array 1 (refer to FIG. 4, FIG. 5).

The line 33 extends above the signal line BLSO and active area $12_4$. The line 33 is connected at one end to the active area $12_4$ via a contact and connected at the other end to bit line BL via a contact. The bit line BL connected to the line 33, or bit line BLO is different from bit line BL connected to the line 32, or bit line BLE. In FIG. 9, some bit lines BL are omitted for clarification purpose. For example, the bit lines BL are provided between the SABL line SABL connected to the active area $12_3$ and the line 32, and between the lines 32, 33, 34 and SABL line SABL adjacent on the right side of the region 25.

The line 34 extends above the active area $12_5$ and bit line control signal line 23. The line 34 is connected at one end to the active area $12_5$ via a contact and connected at the other end to the bit line control signal lines 23 via a contact. As described before, bit line control signal line BLCRL is electrically connected to the bit line control signal line 23 via the shunt line 21.

Figure 10:
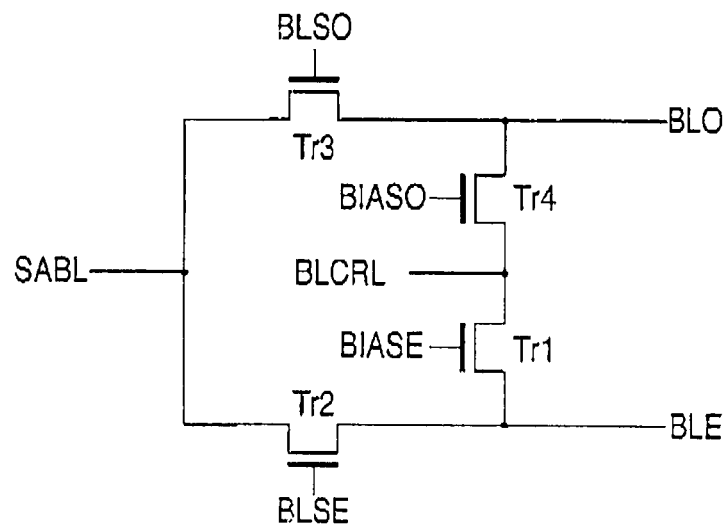
FIG. 10 is a circuit diagram illustrating the hookup circuit area.

FIG. 10 is a circuit diagram illustrating the hookup circuit area. The circuit of FIG. 10 is partly configured by use of the configuration in FIG. 9. As shown in the drawing, the SABL line SABL, which is connected to the sense amplifier, is connected to one-side ends of the current paths of n-type transistors Tr2, Tr3. Potentials of the signal lines ELSE, BLSO, or signals BLSE, BLSO are respectively applied to the gates of the transistors Tr2, Tr3. The other end of the current path of the transistor Tr2 is connected to one end of the current path of the transistor Tr1. A potential of the signal line BIASE, or signal BIASE is applied to the gate of the transistor Tr1. The other end of the current path of the transistor Tr3 is connected to one end of the current path of the transistor Tr4. A potential of the signal line BIASO, or signal BIASO is applied to the gate of the transistor Tr4. A potential of the bit line control signal line BLCRL, or signal BLCRL is applied to the other end of the current path of the transistor Tr1 and the other end of the current path of the transistor Tr4. A connection node of the transistors Tr1 and Tr2 is connected to the bit line BLE and a connection node of the transistors Tr3 and Tr4 is connected to the bit line BLO. The bit line BLE is an even-numbered bit line among bit lines of pairs and the bit line BLO is an odd-numbered bit line.

For example, assume that the bit line BLE among one pair of the bit lines BLE and BLO is selected at the memory cell access time. The signal BLCRL is used to apply the ground potential Vss to an unselected one of the pair of the bit lines BLE and BLO. The signal BLCRL is set to the ground potential at the read time. The transistor TR2 or Tr1 is used to connect selected bit line BLE or BLO to connection node SABL with the sense amplifier circuit. In this context, the signal BLSE is set high and the signal BLSO is set low. As a result, the bit line BLE is connected to the node SABL.

The signals BIASE, BIASEO are used to supply the signal BLCRL to the unselected bit line. In this context, the signal BIASO supplied to the transistor Tr4 connected to the unselected bit line BLO is set high and the signal BIASE supplied to the transistor Tr1 connected to the selected bit line BLE is set low (or, ground potential Vss). As a result, the unselected bit line BLO is set to a potential of signal BLCRL, i.e., the ground potential Vss.

Figure 11:
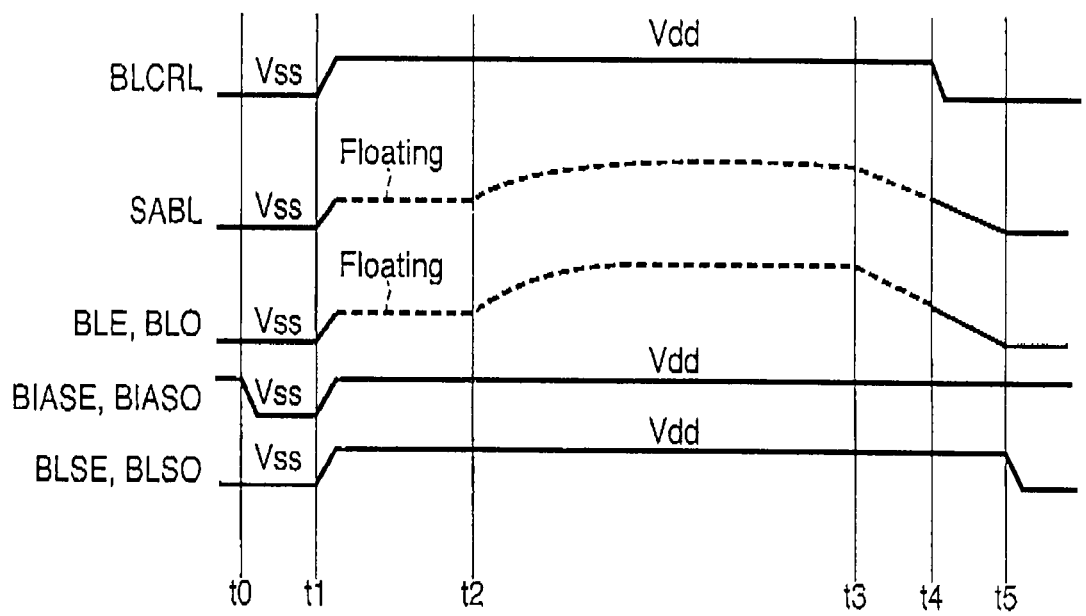
FIG. 11 illustrates potentials of portions at the data erasing.

FIG. 11 shows potentials of nodes of FIG. 9 at the data erase time. All word lines WL in the selected block are set to the ground potential Vss and all word lines WL in the unselected block are made to float. At the data erase time, the signals BIASE, BIASEO are set to the ground potential Vss (timing t0). Then, the signals BLCRL, BIASE, BIASED, BLSE, BLSO are set to the power supply potential Vdd, i.e., high level (timing t1). As a result, the bit lines BLE, BLO and node SABL are charged. When an erase voltage is applied to the well from timing t2 in this state, potentials of the bit lines BLE, BLO rise due to forward bias by the well. As a result, in the selected block, electrons in the floating gate are emitted into the channel and a state of data "1" (or, erase state) which demonstrates the lower threshold voltage.

As described above, according to the semiconductor memory device of the first embodiment, a control signal required to be supplied to a large number of portions scattering along the Y direction in the hookup circuit area, i.e., the signal BLCRL is transmitted through the first shunt lines on both ends of the hookup circuit in the X direction and the second shut line extending in the Y direction of the hookup circuit. This negates the necessity of an line that transmits the control signal between SABL lines (bit lines). Thus, even if the line-and-space dimension of the SABL lines, which are most densely arranged, are too small to secure space for the control signal line to be placed due to miniaturization of the semiconductor memory device, the control signal line can be wired.

Further, the second shunt line is realized by the same line as the control gate electrode and provided in a space on the substrate that is conventionally present due to the request from the design rule. This does not require an additional area for arranging the second shunt line. As a result, the dimension of the hookup circuit area of the present embodiment in the Y direction can be maintained from without application of the present embodiment.

Further, the dimension in the X direction can be the same in the sense amplifier circuit area and hookup circuit area. That is, the pitch of SABL lines (or, the width of SABL line+the distance between SABL lines) and the width of a region for arranging lines in the SABL line group, i.e., region 25 are the same in the sense amplifier circuit area and hookup circuit area. Therefore, SABL lines extending over the sense amplifier circuit area and hookup circuit area can be straight without a crank shape in a portion near the boundary between the sense amplifier circuit area and the hookup circuit area. Thus, an increase in the dimension of the hookup circuit area in the Y direction caused by the crank shape does not occur.

Second Embodiment

A second embodiment is optionally used with the first embodiment.

The first embodiment negates the necessity of providing an line for transmitting the bit line control signal BLCRL in SABL line group. Therefore, the pitch of the lines in the boundary region is reduced. The second embodiment takes advantages of it.

FIG. 12 illustrates the layout of components of a part of a bit line control circuit 2 of a semiconductor memory device according to the second embodiment. More specifically, FIG. 12 illustrates a region 25 in the SABL line group. FIG. 13 illustrates the layout of a portion corresponding to FIG. 12 without application of the second embodiment. As shown in FIG. 13, an upper transistor 131 such as the transistor Tr1 and lower transistor 132 such as the transistor Tr2 share an active area 133 in the boundary therebetween. A contact 141 for an active area $133_1$ is formed in the centre of the active area $133_1$ in the X direction. Likewise, a contact 142 for an active area $133_2$ is also formed in the center of the active area $133_2$ in the X direction. On the other hand, a contact 143 for an active area $133_3$ is deviated off the center of the active area $133_3$ in the X direction. This may occur if a region in the X direction for forming the line of the SABL line group is narrow, and therefore a contact must be formed in limited available area in order to secure a area for other lines (not shown).

Such restriction on the arrangement of components in the region 25 for placing line in the SABL line group is alleviated in the first embodiment compared to the structure of FIG. 13, which results is increased degree of freedom of the arrangement of contacts. As shown in FIG. 12, the positions of the active areas are adjusted so that contacts to the respective active areas in the respective transistors 131, 132 shown in FIG. 13 is in the center of the corresponding active areas in the X direction. Assumed that a contact 51 above the gate electrode G1 (for example, corresponding to the signal line BLSO) configuring an upper transistor Tr11 (for example, corresponding to the transistor Tr3) remains the same position from that in FIG. 13 due to some restriction, i.e., the same position of the contact 143 of FIG. 12. First, in order to position the contact 51 at the center of an active area $41_1$ in the X direction, active areas of the transistors Tr11, Tr12 are separate and realized as active areas 41, 42. The transistor Tr11 includes the gate electrode G1 and impurity diffusion layers in the active areas $41_1$, $41_2$. The transistor Tr12 includes the gate electrode G2 and impurity diffusion layers in the active areas $42_1$, $42_2$.

The position of the contact 54 in the active area $42_2$ in the X direction remains the same from that of the contact 142 of FIG. 13. Further, the contact 53 in the active area $42_1$ is positioned at the center of the active area $42_1$ in the X direction. As a result, the contacts 53, 54 in transistor Tr12 are positioned at their respective center of the active areas $42_1$, $42_2$ in the X direction.

The active area 41 for transistor Tr11 is arranged to keep the position of the unmovable contact 51 at the center of the active area $41_1$ in the X direction. The contact 52 in the active area $41_2$ is positioned at the center of the active area $41_2$ in the X direction.

With the above layout, in both transistors Tr11, Tr12, the contacts 51 to 54 are placed at the center of the corresponding active areas $41_1$, $41_2$, $42_1$, $42_2$ in the X direction.

The second embodiment takes advantages of the benefits from the first embodiment to form active areas independent for each transistor in the region of the SABL line group such as region 25, and can adjust the positions in the X direction of the active areas in order to position the contacts at the center of the respective active areas. Therefore, the layouts of the transistors match, and as a result, the characteristics of the transistors are more uniform.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first active area in a semiconductor substrate;
memory cells on the semiconductor substrate;
first bit lines;
a first line extending in a direction that intersects with the first bit lines and transmitting a control potential to unselected ones of second bit lines connected to the memory cells;
a second line electrically connected to the first line and extending along the first bit lines;
a third line electrically connected to the second line and extending in a direction that intersects with the first bit lines; and
a fourth line electrically connecting both the third line and portions in the first active area corresponding to nodes to which the control potential is applied.

2. The device of claim 1, further comprising:
a second active area in the semiconductor substrate separated from the first active area and;
a potential application region in the semiconductor substrate between the first active area and the second active area and connected to a well in the semiconductor substrate, wherein
the third line is formed above the semiconductor substrate between the first active area and the potential application region.

3. The device of claim 2, wherein:
each of the memory cells includes a charge trapping layer formed above the semiconductor substrate with an insulating film interposed therebetween, and a control gate electrode formed above the charge trapping layer with an insulating film interposed therebetween, and
the third line is in a layer disposed with the control gate electrode and is formed of the same film as a film of the control gate electrode.

4. The device of claim 1, further comprising a hookup circuit area that includes the first bit lines, is electrically connected to the first bit lines and the second bit lines and selectively connects one of the first bit lines to one of the second bit lines, wherein
the second line is at an end of the hookup circuit.

5. The device of claim 1, wherein the second line and the first bit lines are formed of lowest metal lines above the semiconductor substrate.

6. The device of claim 1, wherein the first line and the second bit lines are formed of second-lowest metal lines above the semiconductor substrate.

7. The device of claim 1, wherein the potential application region is requested to be provided in a first position in a direction along the first bit lines by a design rule.

8. The device of claim 1, wherein:
the first bit lines are arranged at an interval of a first width,
the first bit lines include two first bit lines that are arranged at an interval of a second width larger than the first width, and
the fourth line is in a line region between the two first bit lines.

9. The device of claim 8, wherein one of the first bit lines is electrically connected to the active area in the line region.

10. The device of claim 1, wherein the control potential is at a low level when data is read from the memory cells and is at a high level to erase data in the memory cells.

11. The device of claim 1, further comprising a hookup circuit, wherein the hookup circuit includes:
 a first transistor electrically connected between one of the first bit lines and one of a pair of second bit lines of the second bit lines,
 a second transistor electrically connected between the one of the first bit lines and the other one of the pair of second bit lines,
 a third transistor electrically connected between the one of the pair of second bit lines and the first line, and
 a fourth transistor electrically connected between the other one of the pair of second bit lines and the first line.

12. The device of claim 1, further comprising a hookup circuit area that includes the first bit lines, is electrically connected to the first bit lines and the second bit lines and selectively connects one of the first bit lines to one of the second bit lines, and
 a sense amplifier circuit area including the first bit lines and amplifying potentials on the first bit lines, wherein
 a width of and interval between the first bit lines in the hookup circuit area are equal to a width of and interval between the first bit lines of the sense amplifier circuit area.

13. The device of claim 1, wherein
 the first bit lines are arranged at an interval of first width,
 the first bit lines include one pair of first bit lines that are arranged at an interval of a second width larger than the first width,
 the fourth line is in an line region between the pair of first bit lines,
 the first active area includes separate first and second portions that are separated from each other in the line region,
 the device further comprises a gate electrode extending in a direction that intersects with the first bit line above the semiconductor substrate, a first contact on the first portion in the center of the first portion in a direction along the gate electrode, and a second contact on the second portion in the center of the second portion in the direction along the gate electrode, and
 positions of the first and second portions in the direction along the gate electrode are different.

* * * * *